United States Patent [19]
Peterson et al.

[11] Patent Number: 6,097,627
[45] Date of Patent: Aug. 1, 2000

[54] QUANTUM RANDOM ADDRESS MEMORY WITH NANO-DIODE MIXER

[75] Inventors: William M. Peterson, Chandler, Ariz.; Glenn A. Glass, Villa Grove, Ill.; Daniel S. Marshall, Chandler, Ariz.

[73] Assignee: Motorola, Inc., Schaumburg, Ill.

[21] Appl. No.: 09/163,878

[22] Filed: Sep. 30, 1998

[51] Int. Cl.[7] .................................................. G11C 11/36
[52] U.S. Cl. ............................ 365/175; 365/151; 365/153
[58] Field of Search .................................... 365/151, 153, 365/167, 148, 158, 175

[56] References Cited

U.S. PATENT DOCUMENTS 5,323,344  6/1994  Katayama et al. ...................... 365/162

*Primary Examiner*—David Nelms
*Assistant Examiner*—David Lam
*Attorney, Agent, or Firm*—Eugene A. Parsons; William E. Koch

[57] ABSTRACT

Quantum random address memory apparatus including a low dimensional plurality of address ports, a plurality of nano-memory elements, nano-diodes coupling the address ports to a high dimensional plurality of the plurality of nano-memory elements, and data output ports and structure coupled to the plurality of nano-memory elements. The high dimensional plurality of nano-memory elements is greater than the low dimensional plurality of address ports by a number resulting in substantially error free memory recalls.

18 Claims, 8 Drawing Sheets

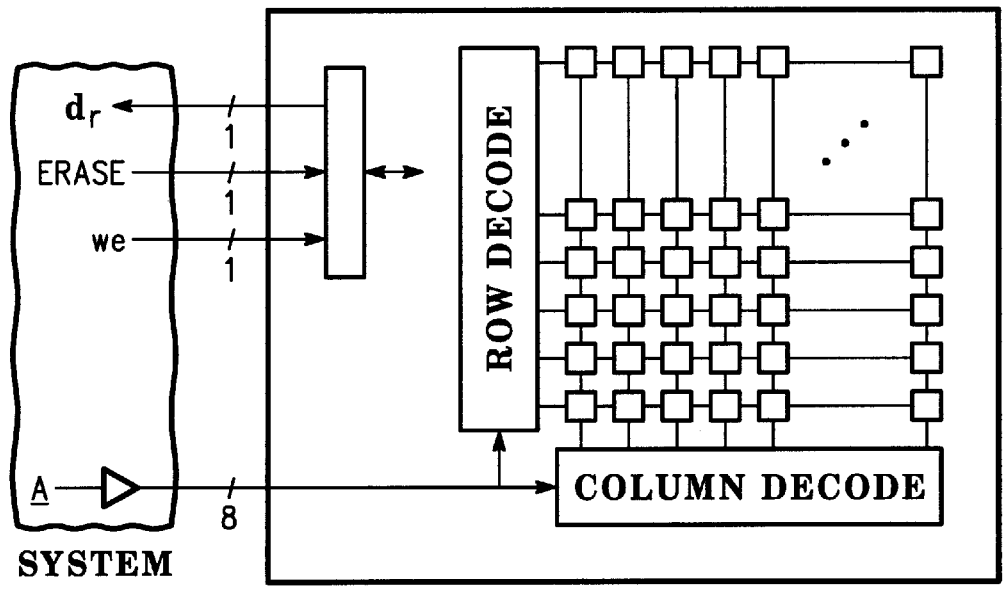
- *PRIOR ART* - FIG. 1
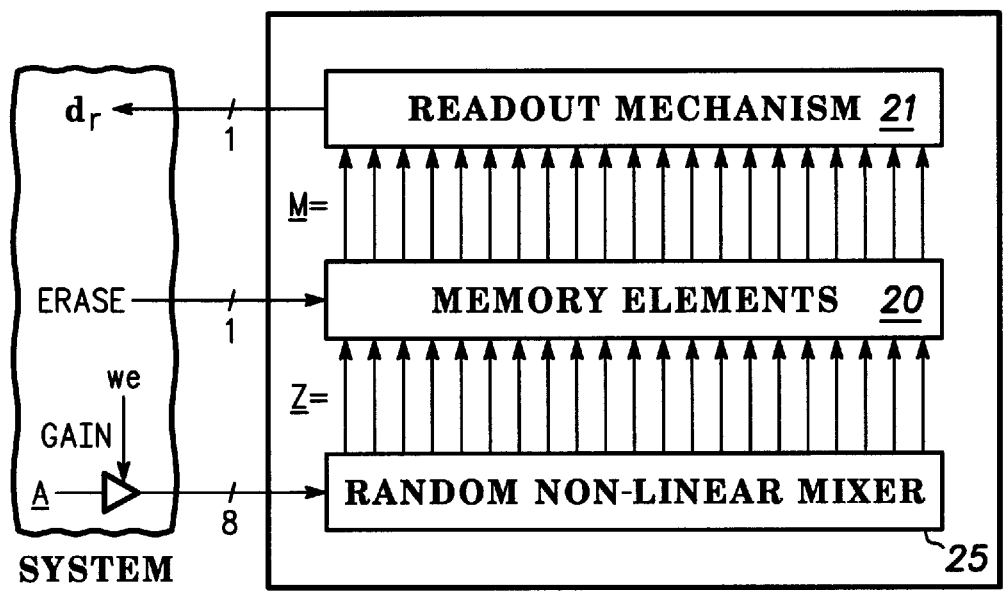
FIG. 2

QUANTUM RANDOM ADDRESS MEMORY WITH NANO-DIODE MIXER

FIELD OF THE INVENTION

The present invention pertains to quantum random address memory apparatus and more specifically to a novel memory with a nano-diode mixer.

BACKGROUND OF THE INVENTION

At the present time memories are utilized in virtually every type of electrical and electronic device to store data, e.g. information, operating instructions, etc. These memories are manufactured in a large variety of types including random access memories (RAM), read only memories (ROM), erasable/programmable memories (EPROM), electronically erasable/programmable memories (EEPROM), to name a few. Also, these various memories are manufactured using a variety of techniques and physical concepts, e.g. magnetic memories, capacitive memories, etc., which are in turn divided into active arrays and passive arrays. Further, at least some of the memories are dense enough to allow up to mega-bytes of information to be stored in a single memory module of practical size.

However, one major problem that is prevalent in all of the prior art memories is the fact that each bit of memory must be addressed individually by means of critically positioned conductors to read (and/or write) information from (or to) the bit. Most conventional memories are intrinsically two dimensional. The usual addressing technique for 2-D memories requires the selection of a row and column port of the array which are common to the selected bit. These rows and columns provide access to localized memory elements that are uniformly distributed in one plane. This results in hundreds of critically positioned conductors (rows, columns and I/O terminals or ports) in conjunction with the large arrays of memory bits making up a large memory. In many instances the I/O ports actually require more chip real estate or area than the array of memory bits. Because present day manufacturing techniques are limited to some type of lithography in the fabrication of the memory arrays and because the line size of the lithography is limited to submicron (generally 0.25 $\mu$m), the size of present day memories is quickly reaching an upper limit. This is primarily due to escalating fabrication costs as well as undesired quantum effects. (For example, Professor W. Maly at Carnegie Mellon showed that extrapolations of cost projections in the SIA's 1997 National Technology Roadmap for Semiconductors result in single-die costs as high as $1800 for DRAMS.) Further, at room temperature, as the quantized number of electrons per gate approaches one, probability of logic error or memory error increases dramatically.

At the present time, the computer industry relies on logic and memory functions implemented with field effect transistors which cease to operate when miniaturized to smaller than about 100 nm in gate length. Yet, the motivation for continued miniaturization is such that all major corporations are conducting research to find nanometer-sized implementations for the logic and memory functions. In the published research literature on such nanometer-sized functions, three major problems remain: unacceptably high error rates at room temperatures; lack of cost effective mass production; and no effective I/O interface with ordinary CMOS logic.

Many or all of these problems are solved or partially solved by quantum random address memory apparatus disclosed in a copending United States Patent Application entitled "Quantum Random Address Memory", filed of even date herewith, bearing attorney docket number CR97-097, and assigned to the same assignee. However, some improvements in the fabrication of various specific components are envisioned herein.

It is a purpose of the present invention to provide new and improved quantum random address memory apparatus.

It is another purpose of the present invention to provide new and improved quantum random address memory apparatus with a mixer that is relatively simple and inexpensive to manufacture.

It is still another purpose of the present invention to provide new and improved quantum random address memory apparatus with random nano-diodes as the mixer elements.

SUMMARY OF THE INVENTION

The above problems and others are substantially solved and the above purposes and others are realized in quantum random address memory apparatus including a low dimensional plurality of address ports, a plurality of nano-memory elements, nano-diodes coupling the address ports to a high dimensional plurality of the plurality of nano-memory elements, and data output ports and structure coupled to the plurality of nano-memory elements. The high dimensional plurality of nano-memory elements is greater than the low dimensional plurality of address ports by a number resulting in substantially error free memory recalls.

In a preferred embodiment the nano-diodes are fabricated by a process including the steps of providing a supporting structure, which may be, for example, a plurality of address strips with a low dimensional plurality of addresses or a plurality of random nano-memory elements formed in a layer of material. First and second materials are selected which cooperate when joined to form one of a p/n diode or a Schottky diode and first and second overlying blanket layers are sequentially formed of the first and second materials on the surface of the supporting structure. An etch mask is positioned on the second blanket layer, so as to define a plurality of randomly positioned nano-diodes and the first and second blanket layers are etched, using the etch mask, to form the plurality of randomly positioned nano-diodes.

In one embodiment the plurality of nano-diodes are positioned so that each nano-diode has a first electrode coupled to one of the address strips. A plurality of random nano-memory elements are positioned on the second blanket layer so as to randomly connect the nano-memory elements to a second electrode of the nano-diodes so that a high dimensional plurality of the nano-memory elements are connected to the address strips through the plurality of nano-diodes.

BRIEF DESCRIPTION OF THE DRAWINGS

Referring to the drawings:

FIG. 1 is a simplified block diagram of a prior art flash memory;

FIG. 2 is a simplified block diagram illustrating various components and their operation in a quantum random address memory in accordance with the present invention;

DESCRIPTION OF THE PREFERRED EMBODIMENTS

Figure 3:
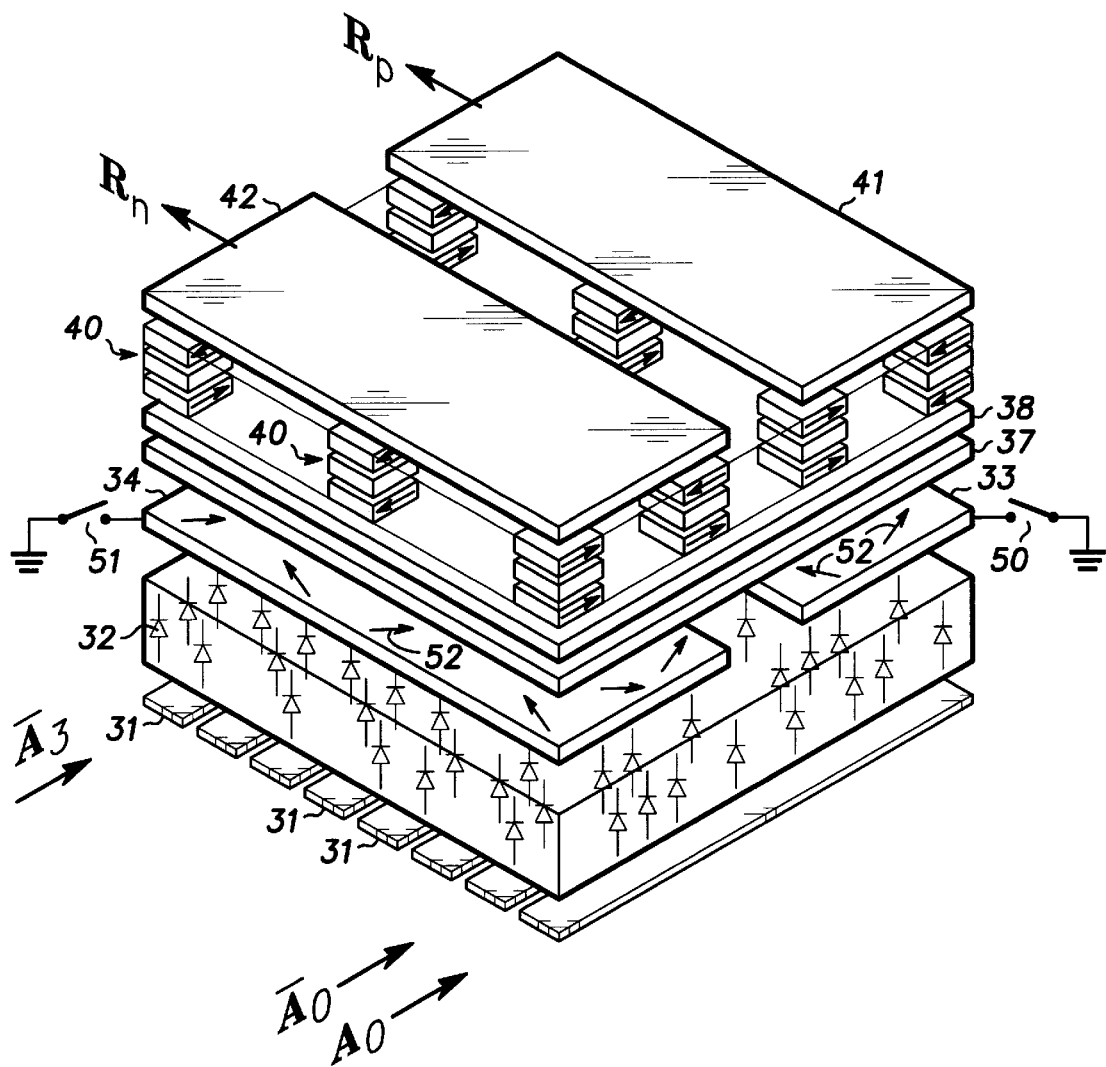
FIG. 3 is a simplified isometric, partial schematic, view of an embodiment of quantum random address memory apparatus in accordance with the present invention.

Turning now to the drawings and specifically to FIG. 1, a prior art 256×1 flash memory is illustrated in simplified block form. The operation of the flash memory will be understood by those skilled in the art and, therefore, will not be explained in detail herein. The conventional flash memory uses spatially independent bit cells by splitting the 256 addresses into 16 rows and 16 columns, as shown in FIG. 1. One cell, capable of storing one bit, is positioned at each row-column intersection so that each cell has a unique row-column intersection at which it can be addressed without effecting any of the other cells. It should be noted however, that the prior art flash memory is a two dimensional device only and utilizing any of the well known present practices requires the use of lithography for the fabrication of every bit. Further, the best that can be produced at the present time results in a chip size of approximately 2000 square microns.

Turning now to FIG. 2, a simplified block diagram/flow chart is provided illustrating various components and their operation in 256×1 quantum random address memory apparatus 10 in accordance with the present invention. The simplified block diagram/flow chart of FIG. 2 is provided only for use in describing the operation and theory of the apparatus 10 and is not intended to describe a complete working structure. Apparatus 10 of FIG. 2 includes eight address ports, $A_0$ through $A_7$, that are illustrated as A and are coupled through eight buffer amplifiers to random nonlinear mixer elements 25. Because of the number of mixer elements 25 and the connections to the eight address ports, as illustrated in FIG. 2, eight address conductors into the system results in 10,000 conductors out. The mixer elements 25 are coupled to memory elements 20 which are in turn coupled to readout mechanism 21. While more memory elements may be included, it is assumed that at least 10,000 memory elements 20 are coupled to 10,000 mixer elements 25. Here it should be noted that 10,000 memory elements are utilized because that number yields a substantial noise margin, as will be explained presently, as well as a small area of about 4 square microns for a 256×1 bit memory. Thus, apparatus 10 has a total area approximately 500 times smaller than the area of the prior art flash memory illustrated in FIG. 1.

To understand the operating principle of apparatus 10, it should be understood that statistically independent bit cells (statcells) are used. First, vector M, which comprises charges on 10,000 nano-memory elements 20, such as polymer molecules, quantum dots, etc., is cleared or randomized. This clears all 256 statcells to the logical '0' state. Now only the statcells that are selected to be logical '1''s need to be written. All 256 bits are stored, in a distributed fashion, in the memory vector M. Each nano-memory element in M stores only a small fraction of each of the 256 bits. That is, each whole bit is distributed among all of the 10,000 nano-memory elements of M. This distributed code provides excellent noise and fault tolerance.

For each address A, there is a different random vector $Z_A$ of dimension 10,000. The 10,000 nano-memory elements in each $Z_A$ vector are each +1 or −1. The independence of the 256 statcells is achieved based upon simple probabilities. For example, writing a '1' bit into the statcell corresponding to address A=35 does not change the data bit in the statcell corresponding to address A=36 because it is almost certain that $Z_{35}$ has nearly zero correlation with $Z_{36}$.

To read out the data bit stored in statcell 35, simply measure the degree of similarity between the two patterns M and $Z_{35}$. One way to do this is to threshold the scalar product of $Z_{35}$ and M. For example, if $Z_{35}$ is added to M, then this new M' will be more similar to $Z_{35}$ (i.e. data bit=1) than if the addition had not been done (i.e. data bit=0). Note that the vector or pattern $Z_{35}$ is used as a reference, somewhat like a reference beam in holography or a channel code in CDMA telephony.

To write a '1' data bit to statcell 35, simply add $Z_{35}$ to M. Likewise, to write a '1' data bit to statcell 36, simply add $Z_{36}$ to M. Note that $Z_{35}$ and $Z_{36}$ are added to the same M. The nearly zero correlation keeps the data bits in statcells 35 and 36 separate and independent.

In essence, statcell independence occurs because adding $Z_{35}$ to M adds +1 to a specific $subset_1$, of the elements in and subtracts 1 from the remaining specific $subset_2$ of the elements in M. Now, adding $Z_{36}$ to the same m adds as much as it subtracts from the $subset_1$. Likewise, for $subset_2$. The net effect is zero. When the data bit in statcell 35 is read back or recalled (i.e. M is probed with $Z_{35}$), the pattern similarity measure is essentially unchanged. Thus, writing to statcell 36 does not disturb the data in statcell 35. Note that this independence requires random vectors of high dimension (10,000 in this example) for excellent error tolerance. Here it should be understood that the highly accurately positioned memory elements of conventional memories are one extreme of the spectrum while totally random memory elements are the other extreme. There is a lot of middle ground between these extremes which can be achieved by biasing the statistics in favor of even more uncorrelated Z vectors. This middle ground is encompassed in the present disclosure in the term "pseudo-random" which is intended to cover everything from totally random to somewhat randomly positioned, as long as the placement does not require fine detail lithography.

Turning now to FIG. 3, a simplified isometric, partial schematic, view is illustrated of another embodiment of quantum random address memory apparatus 30 in accordance with the present invention. Apparatus 30 includes eight address ports, designated $A_0$ through $A_3$, and the invert or reciprocal of each. In this embodiment the address ports are represented by eight parallel spaced apart conductive strips 31, one strip for each of the address ports. A plurality of mixer elements, which in this embodiment are pseudo-randomly placed nano-diodes 32, each have one terminal (in this embodiment the anode) coupled to the address ports 31. A pair of spaced apart electrical conductors 33 and 34 are positioned over nano-diodes 32 so as to extend transverse to the parallel spaced apart strips 31 with each electrical conductor 33 and 34 coupled (to the cathodes) to a different approximately one half of the plurality of nano-diodes 32. An electrical insulating layer 37 is positioned over conductors 33 and 34 and an electrically conducting layer 38 is positioned over insulating layer 37. A plurality of nano-memory elements, which in this embodiment are pseudo-randomly placed magnetic tunneling nano-junctions 40, are positioned on layer 38. A pair of spaced apart electrical conductors 41 and 42 are positioned over magnetic tunneling nano-junctions 40 so as to extend transverse to the parallel spaced apart strips 31 (generally overlying conductors 33 and 34) with each electrical conductor 41 and 42 coupled to a different approximately one half of the plurality of nano-junctions 40. Conductors 41 and 42 are connected to provide signals $R_p$ and $R_n$, respectively, which when combined ($R_p-R_n$) produce a data bit output. Generally, conductors 33 and 41 define a 'p' section of apparatus 10 and conductors 34 and 42 define a 'n' section. It should be noted that none of the structure illustrated in FIG. 3 requires lithography, except possibly strips 31 and electrical conductors 33, 34 and 41, 42.

Each magnetic tunneling nano-junction 40 includes a pair of magnetic layers separated by a very thin non-magnetic non-conducting layer which serves as a barrier. Also, each magnetic tunneling nano-junction 40 is sandwiched between layer 38 and either conductor 41 or 42 so that one magnetic layer is positioned on layer 38 and the other magnetic layer is positioned on one of conductors 41 or 42. With an appropriate voltage applied carriers will tunnel from one of the magnetic layers to the other magnetic layer through the barrier layer. Each magnetic tunneling nano-junction 40 appears electrically as a resistance with the amount of resistance being determined by the position of magnetic vectors in each of the two magnetic layers. If the magnetic vectors in a nano-junction are pointed in the same direction (parallel) the resistance is a minimum and if the vectors are pointed in opposite directions (antiparallel) the resistance is a maximum. Thus, by setting the magnetic vectors in each nano-junction 40 a '1' or a '0' (represented by a low or a high resistance) can be stored. For additional information on the operation and construction of magnetic tunneling nano-junctions 40, see the copending application entitled "Quantum Random Address Memory with Magnetic Tunneling Nano-Junctions" filed of even date herewith, bearing attorney docket number CR98-092, and assigned to the same assignee.

In the operation of apparatus 30, conductor 33 can be grounded through a switch 50 to write a '1' into the 'p' section and conductor 34 can be grounded through a switch 51 to write a '0' into the 'n ' section. When switch 50 is closed, for example, conductor 33 is grounded, Each nano-diode 32 connected to conductor 33 produces a current in conductor 33 (represented by arrows 52) in accordance with the signals applied to strips 31, which creates a field that sets the magnetic vector in the closest magnetic tunneling nano-junction 40. To read the stored information, a signal is applied to conductive layer 38 and read at conductors 41 and 42 as $R_p-R_n$. Again it must be understood that the nano-diodes 32 and the number of magnetic tunneling nano-junctions 40 are great enough to insure that a write signal applied to each strip 31 effects a substantially different group of nano-diodes 32 and magnetic tunneling nano-junctions 40.

Figure 4:
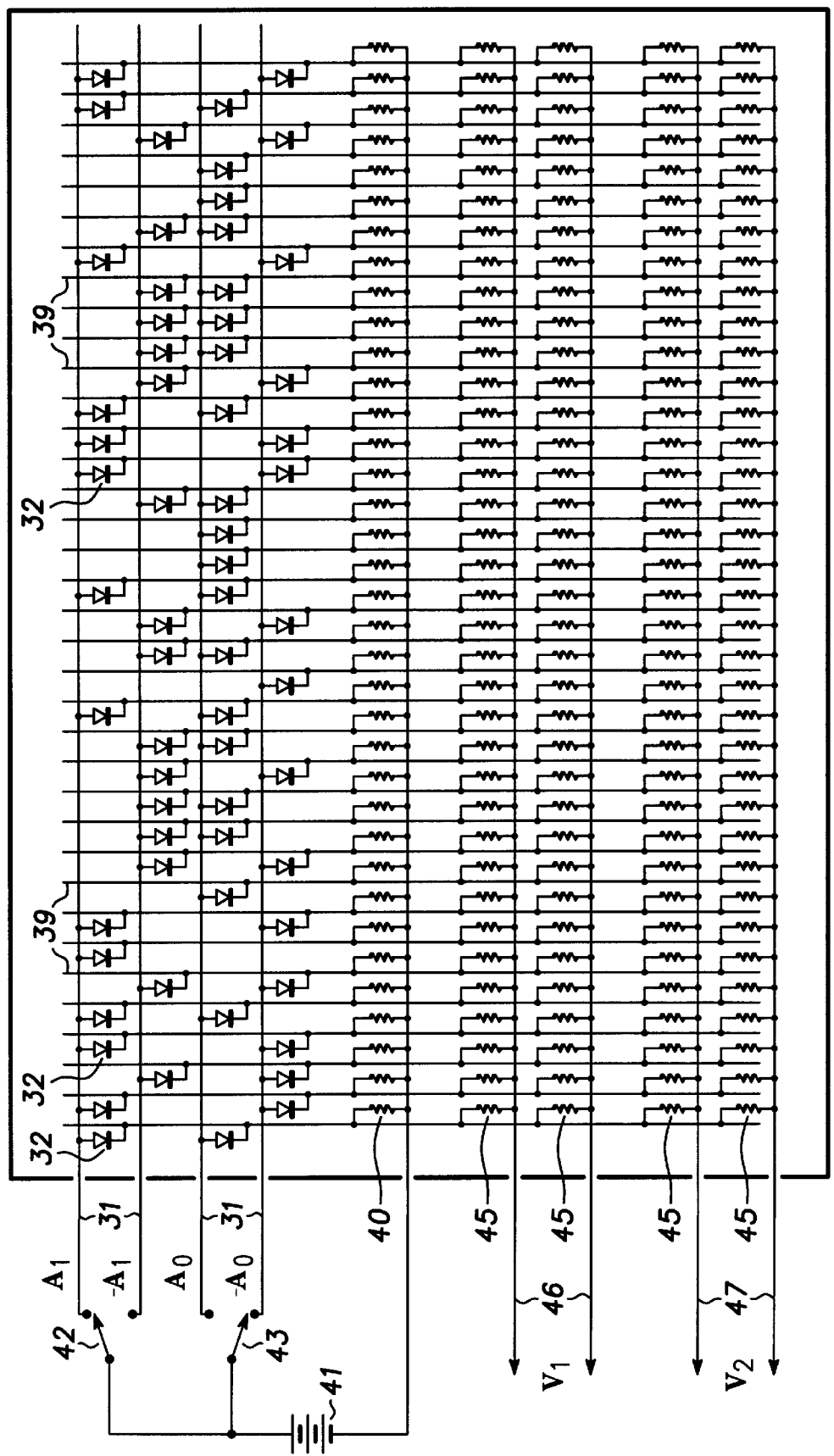
FIG. 4 is a greatly simplified schematic view of the quantum random address memory apparatus illustrated in FIG. 3.

Turning now to FIG. 4, a greatly simplified schematic view is illustrated of the quantum random address memory apparatus 30 illustrated in FIG. 3. The schematic diagram of FIG. 4 is intended to aid in the understanding of apparatus 30 of FIG. 3 and is not intended as a rigorous representation of that apparatus. For simplicity, only four conductive strips 31, designated individually as $A_0$, $-A_0$, $A_1$, $-A_1$ for convenience, are illustrated for address ports. It should be understood that the minus sign, e.g., $-A_0$, indicates a negative, reciprocal, or compliment of the mating signal $A_0$. Also, a plurality of nano-diodes 32, representing mixer elements, each have the anode connected to one of the strips 31 for simplicity in explaining the addressing, as will be understood presently. Further to accentuate the different connections of the mixer elements different nano-diodes are connected to each strip 31. The mixer, including nano-diodes 32, has outputs (for example, the 10,000 terminals described in conjunction with FIG. 5) represented in FIG. 4 by a plurality of mixer leads 39. Each mixer lead 39 is connected through an associated resistor 40 to the negative side of a power supply 41. The positive side of power supply 41 is connected to the arms of a pair of two position switches 42 and 43, which represent the application of an address (1 or 0) to strips 31. A plurality of nano-memory elements 45 are illustrated schematically as resistors each having one end connected to one of the plurality of mixer leads 39. In this simplified schematic view a first data output port $V_1$ is represented by a pair of output leads 46 and a second data output port $V_2$ is represented by a pair of output leads 47. The opposite end of each of the nano-memory elements (resistors 45) is connected to one of the pair of output leads 46 and/or one of the pair of output leads 47. The resistance values of resistors 45 form the M vector.

In this embodiment, to simply illustrate the operation, the pair of switches 42 and 43 are connected to complete a circuit between a selected pair of strips 31 and power supply 41. Switch 42 applies a positive voltage to $A_1$ in a first position and to $-A_1$ in a second position. Switch 43 applies a positive voltage to $A_0$ in a first position and to $-A_0$ in a second position. In each instance the positive voltage is applied to the anode of a different set of nano-diodes 32 and represents a 1 or a 0. The negative side of power supply 41 is connected to each mixer lead 39 through associated resistor 40 to complete the circuit for purposes of this representation.

Figure 5:
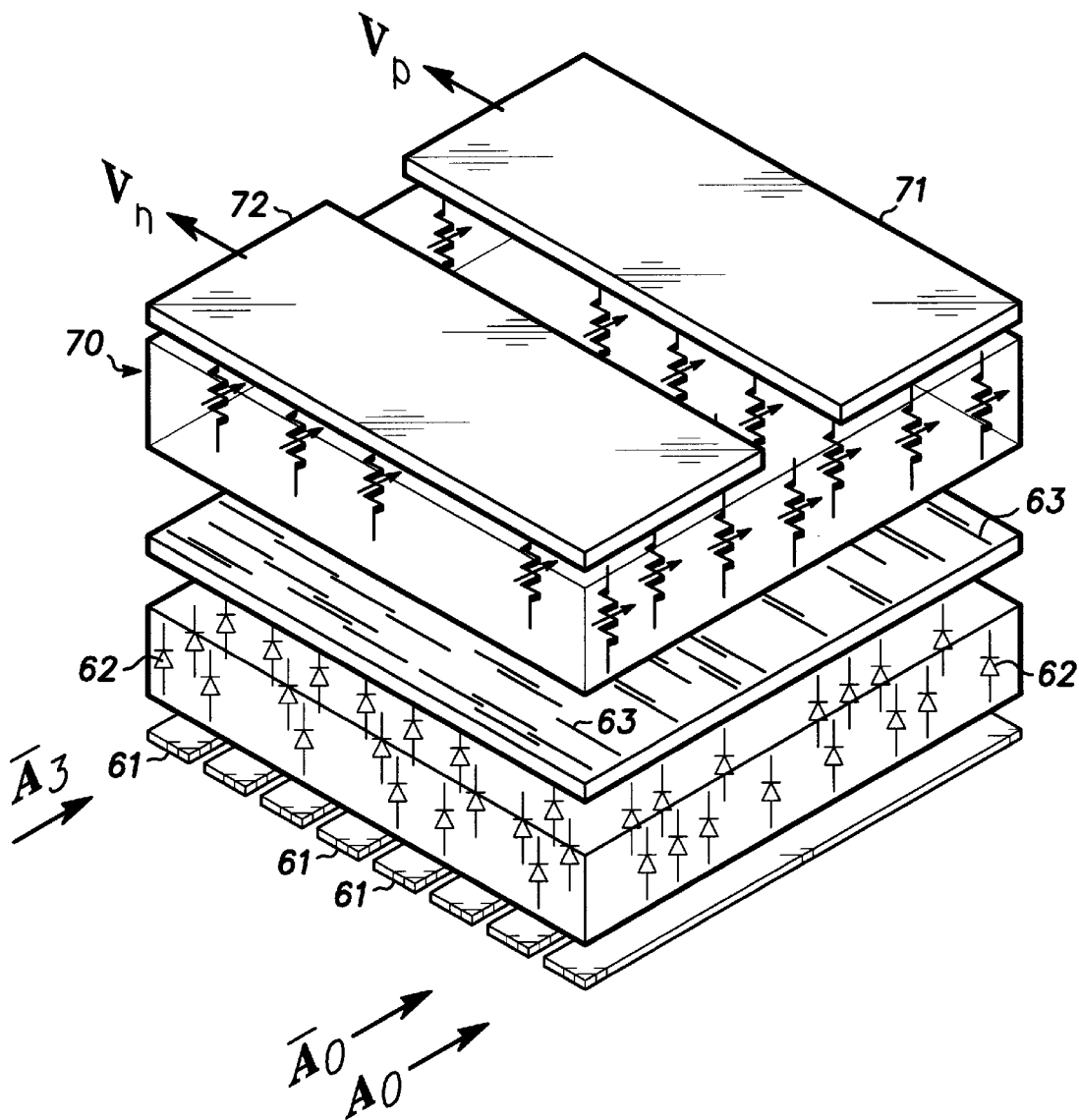
FIG. 5 is a simplified isometric, partial schematic, view of another embodiment of quantum random address memory apparatus in accordance with the present invention.

Referring specifically to FIG. 5, a simplified isometric, partial schematic, view of another embodiment of quantum random address memory in accordance with the present invention is illustrated in the form of apparatus 60. Apparatus 60 includes eight address ports, designated $A_0$ through $A_3$, and the invert or reciprocal of each. In this embodiment the address ports are represented by eight parallel spaced apart conductive strips 61, one strip for each of the address ports. A plurality (generally thousands) of mixer elements, which in this embodiment are pseudo-randomly placed nano-diodes 62 positioned in and by a layer of dielectric material, each have one terminal (in this embodiment the anode) coupled to the address ports 61.

A plurality (generally thousands) of pseudo-randomly positioned, but parallel oriented electrical conductors 63 (formed in a thin dielectric layer for convenience) are positioned over nano-diodes 62 so as to extend transverse to the parallel spaced apart strips 61 with individual conductors pseudo-randomly coupled (to the cathodes) to different nano-diodes or groups of nano-diodes 62. Electrical conductors 63 can be formed and positioned in a variety of different techniques including, for example, conductive polymers or thin metal strands that are suspended in a solution and oriented by a magnetic or electric force during drying of the solution to form a solid layer.

A plurality (generally thousands) of nano-memory elements, which in this embodiment are illustrated as pseudo-randomly placed adaptive resistors 70, are positioned in a dielectric layer of material and on the layer containing electrical conductors 63 so as to be pseudo-randomly coupled by different electrical conductors 63 or groups of electrical conductors 63. Thus, electrical conductors 63 generally pseudo-randomly couple one or more nano-diodes 62 to one or more adaptive resistors 70. Adaptive resistors 70 can be fabricated, for example, by methods described in a U.S. Patent entitled "Circuit Utilizing Resistors Trimmed by Metal Migration", issued Feb. 16, 1988. While adaptive resistors 70 are illustrated herein as nano-memory elements, it should be understood that other elements can be used, including magnetic tunneling nano-junctions, quantum dots, etc.

A pair of spaced apart electrical conductors 71 and 72 are positioned over nano-memory elements 70 so as to extend parallel with electrical conductors 63 and transverse to the parallel spaced apart strips 61, with each electrical conductor 71 and 72 coupled to a different approximately one half of the plurality of nano-memory elements 70. Conductors 71 and 72 are connected to provide signals $V_p$ and $V_n$, respectively, which when combined ($V_p$–$V_n$) produce a data bit output. Generally, conductor 71 defines a 'p' section of apparatus 60 and conductor 72 defines a 'n' section. It should be noted that none of the structure illustrated in FIG. 9 requires lithography, except possibly strips 61 and electrical conductors 71 and 72.

Figure 6:
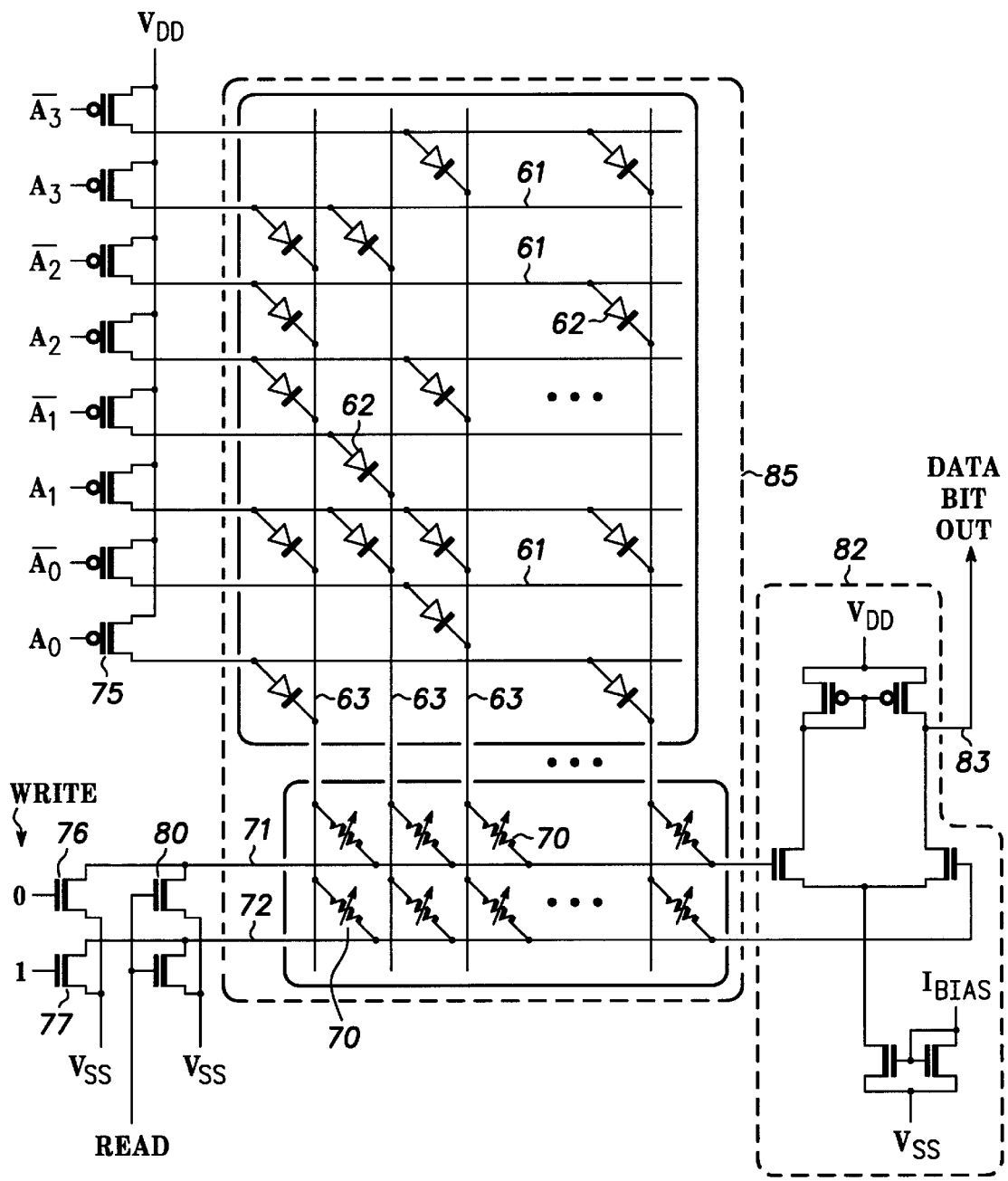
FIG. 6 is a greatly simplified schematic view of the quantum random address memory apparatus illustrated in FIG. 5.

Turning now to FIG. 6, a greatly simplified schematic view is illustrated of the quantum random address memory apparatus illustrated in FIG. 5. The schematic diagram of FIG. 6 is intended to aid in the understanding of apparatus 60 of FIG. 5 and is not intended as a rigorous representation of that apparatus. A plurality of nano-diodes 62 each have the anode connected to one of the strips 61 and the cathode connected to one of electrical conductors 63 to represent mixer elements. A plurality of adaptive nano-resistors 70 each have one end connected to either conductor 71 or conductor 72 and a second end connected to one of electrical conductors 63. For convenience of this explanation, electrical conductors 63 are illustrated as single lines extending the length of the apparatus, but it should be understood that these lines and the connections illustrated are completely pseudo-random. Also, for convenience of this description, each electrical conductor 63 is illustrated as being connected through an adaptive nano-resistor 70 to each conductor 71 and 72. It should be understood, however, that these connections are completely pseudo-random and all of the connections that this implies are possible, from zero connections to nano-diodes 62 and/or adaptive nano-resistors 70 for some electrical conductors 63 to a plurality of nano-diodes 62 and/or adaptive nano-resistors 70 for some electrical conductors 63.

In this embodiment, to simply illustrate the operation, each strip 61 is connected by the source-drain of one of eight FETs 75 to a voltage supply $V_{dd}$. To activate selected ones of FETs 75, one input, $A_0$ through $A_3$, and their complements, are applied to each gate of FETs 75. To write a logic '0' into the memory in any selected one of the sixteen addresses, the selected address is activated and conductor 71 is connected through the source-drain of a FET 76 to a voltage source Vss and a positive pulse is applied to the gate of FET 76. To write a logic '1' into the memory in any selected one of the sixteen addresses, the selected address is activated and conductor 72 is connected through the source-drain of a FET 77 to the voltage source $V_{ss}$ and a positive pulse is applied to the gate of FET 77. Thus, when writing a logic '0', current flows from $V_{dd}$ through the selected FET 75, the specific strip 61 connected to the selected FET 75, through all circuits completed to conductor 71 by connections of nano-diodes 62, electrical conductors 63 and adaptive nano-resistors 70, and through FET 76 to $V_{ss}$. Similarly, when writing a logic '1', current flows from $V_{dd}$ through the selected FET 75, the specific strip 61 connected to the selected FET 75, through all circuits completed to conductor 72 by connections of nano-diodes 62, electrical conductors 63 and adaptive nano-resistors 70, and through FET 77 to $V_{ss}$. The flow of current produced by the write circuit adjusts the adaptive nano-resistors 70 (generally reducing the resistance) so that the current paths formed are predominant during read operations over any other possible current paths.

Figure 10:
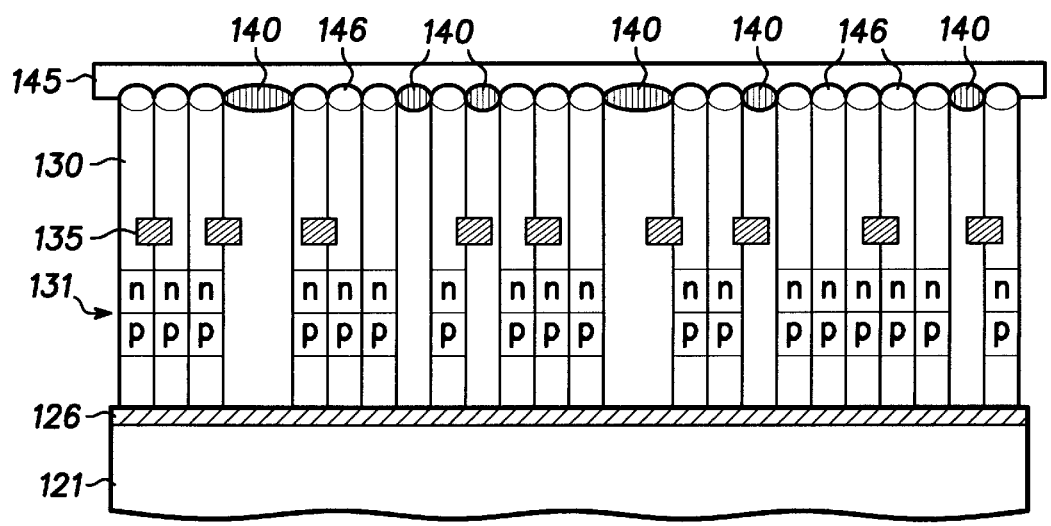
FIG. 10 is a sectional view as seen from the line 10—10 in FIG. 9.

A read circuit includes a pair of FETs 80, each connecting one of the conductors 71 and 72 through a source-drain to voltage supply $V_{ss}$, and both activated by a positive 'read' pulse on the gates. The read circuit further includes a differential amplifier comparator circuit, generally designated 82, having conductors 71 and 72 connected as opposed inputs and a single bit output 83. In this specific embodiment, apparatus 60 of FIG. 10 is connected to operate as a one-time-field-programmable-ROM. Further, because addresses $A_0$ through $A_3$, and their complements are illustrated, 16 memory locations are possible. Here it should be understood that this small memory capacity is used only to simplify the illustration and the accompanying explanation. Data output port 83 is one bit wide, thus, providing a memory 16×1.

A broken line 85 around all but the contact ends of strips 61, nano-diodes 62, electrical conductors 63, and adaptive nano-resistors 70, indicates that all components therein are self-organized nanometer sized elements. It should be specifically noted that no transistors or other patterned devices are needed within broken line 85. Ordinary 0.5 micrometer CMOS techniques can be used to fabricate all of the transistors and circuitry outside of broken line 85. Also, an ordinary 0.5 micrometer CMOS external circuit (not shown) can interface with apparatus 60 by driving the address lines ($A_0$ through $A_3$, and their complements) and write control lines and by reading the logic level on data output port 83. The external circuit applies an address A, which causes (most of) many small currents to flow into a specific subset of adaptive memory elements $M_n$ and $M_p$ and finally to $V_{ss}$. Although this specific subset is initially determined by pseudo-random placement of junctions and adaptive elements, it is uniquely associated with just one address $A_i$, due to statistics of large random numbers. Furthermore, writing data to one address does not lead to a data bit error at another address, again due to the statistics of large random (uncorrelated) numbers.

The thousands of adaptive nano-resistors 70 change resistance values when data is written to apparatus 60 (coincident with the application of a specific address $A_i$. Adaptive nano-resistors 70 are somewhat like artificial neural network synapses, in that they obey a Hebbian learning rule (i.e. they further lower their resistance when current flowing therethrough exceeds a fixed threshold). To write data to apparatus 60, currents are allowed to exceed the fixed threshold, thereby allowing adaptive nano-resistors 70 to change resistance values. The external circuit applies and address $A_i$, which cause (most of) many small currents to flow into a specific subset, $M_n$ and $M_p$, of adaptive nano-resistors 70 and finally to $V_{ss}$ via either write transistor 76 or 77. In this specific embodiment, if a logic '1' is written, then more current flows in the $M_p$ set (conductor 72) of adaptive nano-resistors 70, causing them to lower their resistance values.

To read data from apparatus 60, currents are limited to values well below the fixed threshold, thereby not allowing adaptive nano-resistors 70 to change resistance values. The external circuit applies an address $A_i$, which causes (most of) many small currents to flow into a specific subset, $M_n$ and $M_p$, of adaptive nano-resistors 70 (memory elements) and finally to $V_{ss}$. The current difference between the $M_n$ and $M_p$ adaptive nano-resistor 70 sets is amplified to saturation by comparator circuit 82 yielding the data bit output signal. If more current flows in the $M_n$ set, then the data bit is read as a logic '1'. otherwise it is a logic '0'.

Figure 7:
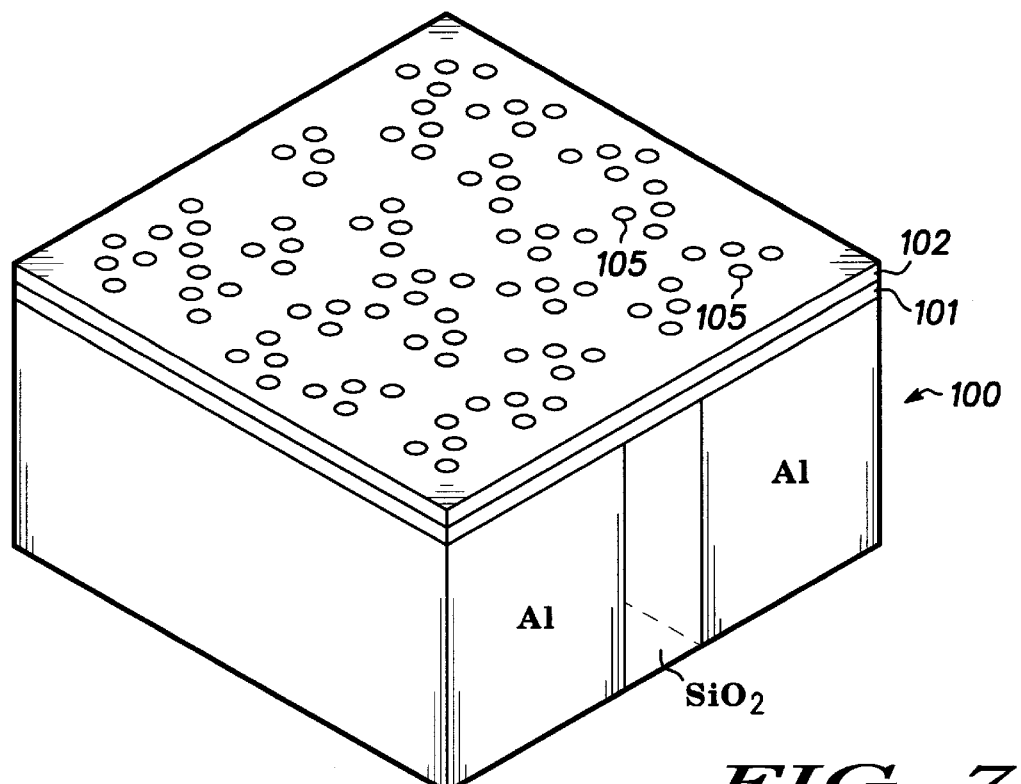
FIG. 7 is a simplified, greatly enlarged, isometric view of an intermediate structure in a method of fabricating random nano-diodes in accordance with the present invention.

Referring specifically to FIG. 7, a simplified, greatly enlarged, isometric view is illustrated of an intermediate structure in a method of fabricating pseudo-random nano-diodes in accordance with the present invention. The pseudo-random nano-diodes described herein may be, for example, nano-diodes 32 described in conjunction with the memory embodiment illustrated in FIGS. 3 and 4 or nano-diodes 62 described in conjunction with the memory embodiment illustrated in FIGS. 5 and 6. It should be understood from the foregoing embodiments that the pseudo-random nano-diodes can be initially formed on any of a number of layers of the memory including the plurality of address strips, the plurality of pseudo-random nano-memory elements, the data output ports, an intermediate layer of pseudo-random electrical conductors, etc. and specific steps described herein are not intended to in any way limit the fabrication method to a specific sequence.

First and second materials are selected which cooperate when joined to form one of a p/n diode or a Schottky diode. For example, the first material can be a semiconductor material doped n or p and the second material can be a semiconductor material doped oppositely p or n. In the specific embodiment of FIG. 7, a first blanket layer 101 of the first material (p doped semiconductor material) is deposited on the surface of a supporting substrate, generally designated 100. In this embodiment supporting substrate 100 is for example the plurality of address strips (only two of which are illustrated). A second overlying blanket layer 102 of the second material (n doped semiconductor material) is deposited on the surface of the first blanket layer 101.

An etch mask is formed on the surface of second blanket layer 102, so as to define a plurality of pseudo-randomly positioned nano-diodes. In this embodiment, to form the etch mask a colloidal solution is deposited on the surface of second blanket layer 102. The colloidal solution contains copolymers or other suitable resist material in suspension. The colloidal solution is dried by some appropriate technique, such as heating in an oven, subjecting it to infra-red or other heat source, etc. and the result is nano dots 105 of etch resist pseudo-randomly positioned over the entire surface of blanket layer 102. Using nano-dots 105 as an etch mask and an appropriate etch determined by the material forming blanket layers 101 and 102, blanket layers 101 and 102 are etched down to supporting substrate 100.

Figure 8:
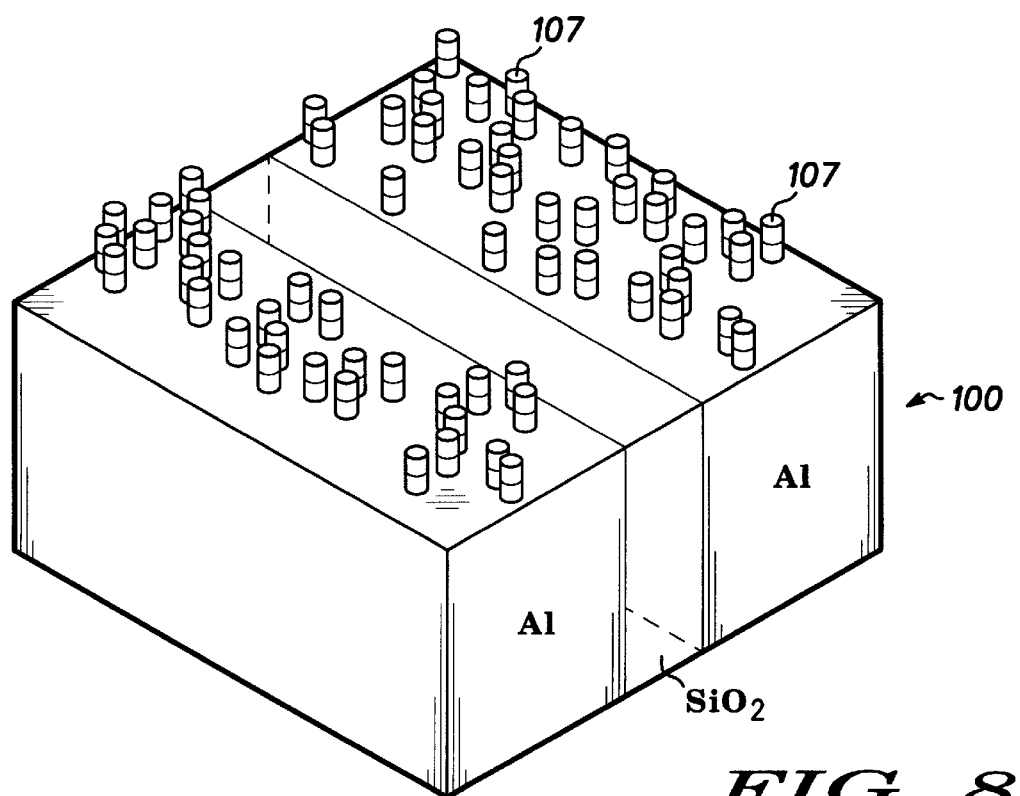
FIG. 8 is a simplified isometric view of an intermediate structure, formed subsequent to the structure of FIG. 7, in a method of fabricating random nano-diodes in accordance with the present invention.

As illustrated in FIG. 8, the etching of blanket layers 101 and 102 results in a plurality of isolated nano-diodes 107 pseudo-randomly positioned on the surface of supporting substrate 100. The major portion of pseudo-random nano-diodes 107 are formed with each diode having one terminal in contact with one of the address strips and the other terminal extending upwardly. Here it should be noted that each diode is intended to carry very small current and, accordingly, is formed very thin (vertical distance from terminal to terminal), generally on the order of a few angstroms to a few nanometers. Thus, the next layer (for example the layer of pseudo-random electrical conductors 63 in FIG. 5) can generally be placed directly on nano-diodes 107 without first using dielectric material to separate nano-diodes 107. However, a planarizing layer of dielectric material can be deposited between nano-diodes 107, if required in a specific application. The remainder of the quantum random address memory can then be formed as previously described in conjunction with the specific embodiments.

Figure 9:
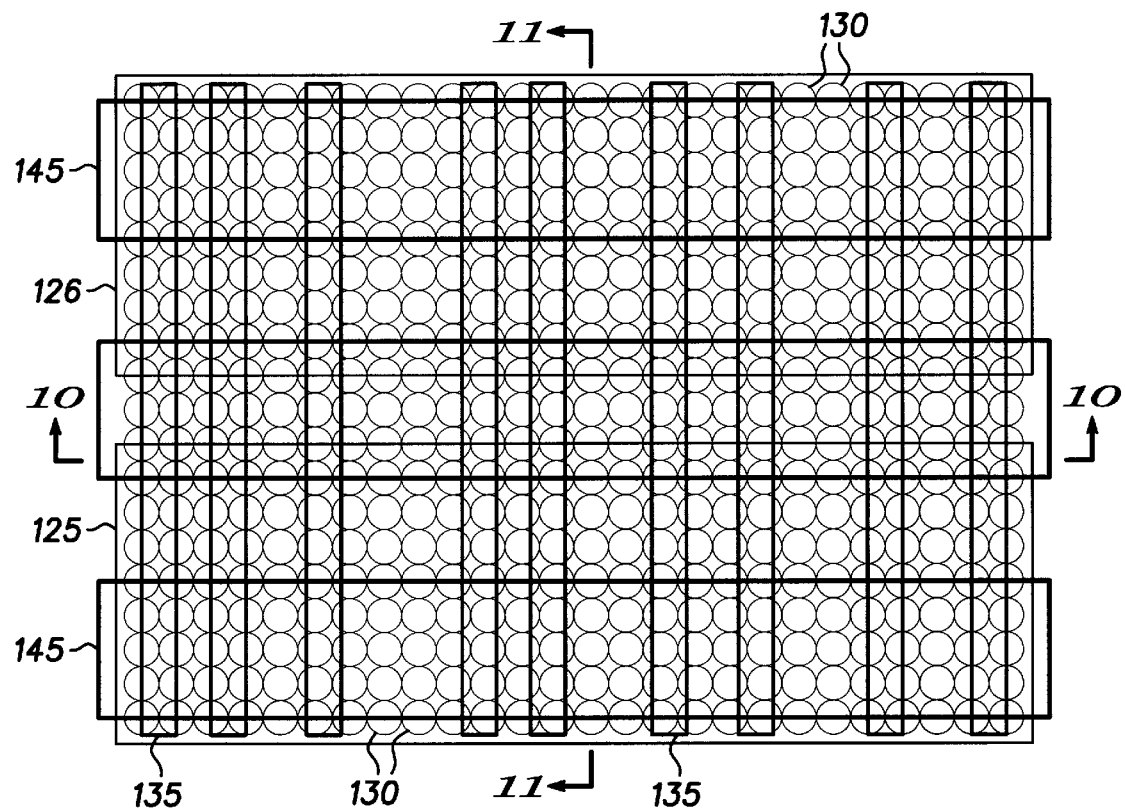
FIG. 9 is a simplified, greatly enlarged, view in top plan of another embodiment of quantum random address memory apparatus in accordance with the present invention.
Figure 11:
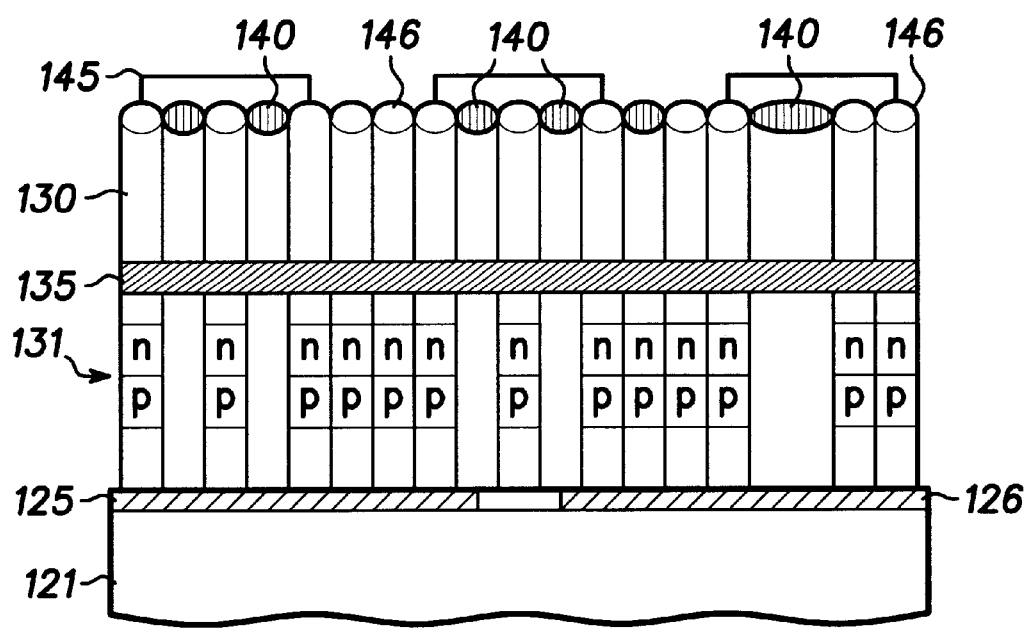
FIG. 11 is a sectional view as seen from the line 11—11 in FIG. 9.

Turning now to FIGS. 9 through 11, another embodiment of quantum random memory apparatus in accordance with the present invention is illustrated in the form of apparatus 120. The description of apparatus 120 will proceed in accordance with a preferred fabrication process to provide a clearer description of the various components. A substrate 121 is provided having at least an upper surface formed of any convenient non-crystalline material. For example, substrate 121 can be silicon with an oxidized upper surface, $SiO_2$ coated soda-lime glass (e.g. Pilkington), a high quality sodium free barium-borosilicate glass (e.g. Corning 7059), etc. Also, apparatus 120 can be a discrete element, a flip-chip coupled to a Si circuit, or it can be fabricated on top of a Si chip isolated with the oxide surface. Further, transistors included to power apparatus 120 can be integrated directly, or on a separate chip.

A pair of spaced apart output conductors 125 and 126 (data outputs on which are designated $V_n$ and $V_p$, respectively) are positioned on the upper surface of substrate 121 to serve as a data output structure for apparatus 120. Output conductors 125 and 126 are formed of any convenient electrically conductive material which forms an ohmic contact with apparatus 120, such as aluminum, and are generally sputtered or evaporated through a mask as they are relatively large and positioning is not critical. A diffusion barrier, such as Ti—W alloy or dense grained TiN, is deposited on top of output conductors 125 and 126 to prevent pitting and diffusion in subsequent process steps, as will become apparent presently. Because the diffusion barrier is very thin, it is not illustrated as a separate layer in FIGS. 10 and 11.

Polysilicon is deposited on the surface of substrate 121 and on the surface of output conductors 125 and 126 (actually on the diffusion barrier) in the form of a large plurality of silicon columns 130. To achieve this feature, a collimated source of silicon atoms is used in a deposition process including directional flux, such as sputtering or molecular beam epitaxy (MBE). Appropriate collimation can be achieved, for example, by positioning the source at a relatively long distance from the surface on which the deposition is to take place. In a specific example, solid source MBE with a base pressure in the $10^{-10}$ Torr range is used to maintain sufficiently low contamination levels and simultaneously achieve the directional deposition. A magnetron or RF sputtering system operating at low pressures, employing energetic ion deflection magnets may be substituted. Oxygen contamination is kept low, in order to maintain good growth morphology.

Silicon columns 130 are formed of columnar grains of silicon with a width, or diameter, preferably less than approximately 100 nm, generally in a range of 500 Å to 1000 Å, and a length generally less than a micron and preferably 0.5 microns or less. Also, silicon columns 130 have relatively underdense grain boundaries (intergrain voids). In a first step of the deposition process a first type of doping in included to produce columns of silicon with a first type of conductivity. At some selected mid-point in the formation of silicon columns 130 the doping is changed to produce an opposite type of conductivity. Specifically, in this embodiment, the deposition process begins with small grain polysilicon with n-type doping and is switched at a midpoint to p-type doping. Thus, each silicon column 130 includes a p-n diode, or a nano-diode, 131 with the p terminal connected to one of output conductors 125 or 126 and the n terminal extending upwardly. Some columns 130 will be connected to the surface of substrate 121 but will not be actively in apparatus 120, as will be understood presently. The silicon grains are continuous across the p-n junctions to provide good electrical conductivity along each silicon column 130. Also the silicon is columnar with the columns having as small a diameter as possible. Care should be taken to prevent any contact with moisture or ambient air between the deposition of the columnar silicon and the following steps because electrostatic forces between water covered grains can cause delamination.

After the formation of silicon columns 130, an oxygen environment anneal is performed on apparatus 120. The grain boundaries of silicon columns 130 are oxidized to provide lateral isolation between silicon columns 130 (i.e. between silicon grains). This anneal is optimized using a diffusion limited process to encourage rapid formation of oxide at the grain boundaries (between columns), but relatively little consumption of the grains themselves. This oxidation of silicon columns 130 passivates dangling bonds at the oxide-silicon interface in a process similar to gate oxidation using Cl and H in the semiconductor industry.

A plurality (generally thousands) of pseudo-randomly positioned, but parallel oriented mixer conductors 135 are formed in silicon columns 130 so as to be positioned over nano-diodes 131 and to extend generally parallel to output conductors 125 and 126 with individual mixer conductors 135 pseudo-randomly coupled (to the cathodes) to different nano-diodes 131 or groups of nano-diodes 131 through silicon columns 130. In one process of forming mixer conductors 135, a thick resist is deposited on the upper ends of silicon columns 130 (which is essentially the upper surface of a polysilicon layer). The thick resist is patterned with elongated vias of pseudo-random length and placement. Preferably, each via has a width approximately equal to the width of each silicon column 130. (e.g. generally in a range of 500 Å to 1000 Å). It should be noted specifically that use of fine lithography in this case requires no mask alignment, and is therefore much simpler than conventional device lithography.

The plurality of pseudo-randomly positioned, parallel oriented mixer conductors 135 are formed by implanting a conductivity enhancing element into the p doped portion of silicon columns 130 through the vias formed in the thick layer of resist. The conductivity enhancing element may include one or a combination of, for example, aluminum, tungsten, molybdenum, yttrium, platinum silicide (PtSi), iridium silicide (IrSi), etc. In the present embodiment, high doses of aluminum are implanted to a shallow depth because aluminum is a p-type dopant in silicon columns 130 and because it operates as a getter to remove excess oxygen from silicon columns 130. Further, any anneal or implant activation required should be at a low enough temperature so as not to damage silicon columns 130. In this embodiment the depth to which mixer conductors 135 are implanted lies in a range of approximately 1000 Å to 2000 Å distance from the upper ends of silicon columns 130. After implantation the thick layer of resist is removed.

With the completion of mixer conductors 135, droplets 140 of insulator material are pseudo-randomly deposited on the polysilicon (adjacent the upper ends of silicon columns 130) so as to form a very porous insulator layer. Droplets 140 are fabricated in this embodiment by depositing the insulator material (e.g. $Al_2O_3$) with a spitting technique, possibilities of which include pulsed electron beam evaporation, laser ablation, deposition from a colloidal solution, etc. The porous insulator layer provides coverage in a range of approximately 75% to 85% of the surface.

A plurality of address ports are represented by parallel spaced apart conductive address strips 145, one strip for each of the address ports. Address strips 145 are positioned on the upper ends of silicon columns 130 and droplets 140 and extend generally perpendicular to mixer conductors 135 and output conductors 125 and 126. Thus, a large plurality (generally thousands) of silicon columns 130 are connected to each address strip 145. In addition, in this preferred embodiment, address strips 145 include a material which forms a Schottky junction or diode 146 at the interface of each silicon column 130 with an address strip 145. Material that performs this function is, for example, tungsten, $PtSi_2$, IrSi, etc. Address strips 145 are fabricated by depositing a layer of the selected material by magnetron sputtering, evaporation, or the like, then masking, patterning and etching to form the desired number and size of strips. Depending upon performance demands, the selected material can be deposited directly through a removable mask. In some applications, 'noble metal' silicides can be formed at temperatures compatible with aluminum output contacts 125 and 126 if a high quality diffusion barrier is used.

Here it should be noted that p-n junctions or diodes 131 form non-reversible adaptive nano-memory elements. Mixer conductors 135, the upper portions of silicon columns 130 and Schottky diodes 146 form thousands of pseudo-random mixer elements coupling the nano-memory elements to address strips 145. Droplets 140 localize and separate individual Schottky diodes 146 to provide pseudo-random connections to address strips 145. Writing data into the memory is accomplished by reverse biasing selected p-n junctions or diodes 131 until reverse breakdown allows large current densities to flow, and the selected p-n junction or diode 131 is destroyed. When a lower reverse bias is applied to read the memory, the destroyed p-n junctions or diodes 131 will be a conductor whereas neighboring p-n junctions or diodes 131 which have not been destroyed will be highly resistive. Here it should be noted that substantially uniform grain size and doping in the fabrication of p-n junctions or diodes 131 will produce a relatively uniform reverse breakdown threshold. Also, it should be understood that p-n junctions or diodes 131 could be used with other mixer elements disclosed, or the upper portions of silicon columns 130 and Schottky diodes 146, which form thousands of pseudo-random mixer elements, could be used with other adaptive nano-memory elements. Conductors 125 and 126 are connected to provide signals $V_p$ and $V_n$, respectively, which when combined $(V_p-V_n)$ produce a data bit output, as described above. It should be noted that none of the structure illustrated in FIGS. 9 through 11 requires lithography, except possibly address strips 145 and output conductors 125 and 126. Also, while a specific embodiment has been disclosed for purposes of explanation it should be understood that many of the process steps and the structure could be reversed.

Thus, a new and improved quantum random address memory is disclosed which incorporates new and novel pseudo-random nano-diodes as a portion of the mixer. The quantum random address memory with new and improved pseudo-random nano-diodes is relatively simple and inexpensive to manufacture and has virtually no upper limits on the size, or number of bytes it can store. Also, the quantum random address memory with new and improved pseudo-random nano-diodes is highly manufacturable and does not require lithography to produce the mixer elements but is still much smaller than prior art memories.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A quantum random address memory with nano-diode mixer comprising:

a plurality of address ports providing a low dimensional plurality of addresses;

data output structure;

a plurality of nano-memory elements;

a plurality of pseudo-randomly positioned, non-linear nano-diodes coupling one of the plurality of address ports and the data output structure to a high dimensional plurality of the plurality of nano-memory elements; and the other of the plurality of address ports and the data output structure being coupled to the plurality of nano-memory elements, wherein the high dimensional plurality of nano-memory elements is greater than the low dimensional plurality of addresses.

2. A quantum random address memory with nano-diode mixer as claimed in claim 1 wherein the high dimensional plurality of nano-memory elements is greater than the low dimensional plurality of addresses by at least a factor of 40.

3. A quantum random address memory with nano-diode mixer as claimed in claim 1 wherein the plurality of nano-memory elements are pseudo-randomly placed on a support structure.

4. A quantum random address memory with nano-diode mixer as claimed in claim 3 wherein the nano-memory elements each include one of quantum dots, magnetic tunneling junctions, and resistors.

5. A quantum random address memory with nano-diode mixer as claimed in claim 1 wherein the nano-diodes are one of p/n diodes or Schottky diodes.

6. A quantum random address memory with nano-diode mixer as claimed in claim 1 wherein the address ports include parallel spaced apart conductive strips, one strip for each of the address ports and the data output ports and structure include a pair of spaced apart electrical conductors extending transverse to the parallel spaced apart strips with each electrical conductor coupled to a different approximately one half of the plurality of nano-memory elements.

7. A quantum random address memory with nano-diode mixer as claimed in claim 6 wherein the data output ports and structure include circuitry coupled to the pair of spaced apart electrical conductors for comparing the electrical signals at each of the pair of spaced apart electrical conductors.

8. A quantum random address memory with nano-diode mixer as claimed in claim 7 wherein the circuitry for comparing the electrical signals includes a differential amplifier.

9. A quantum random address memory with nano-diode mixer as claimed in claim 1 wherein the data output ports and structure include a piezo layer with the plurality of nano-memory elements positioned thereon.

10. A quantum random address memory as claimed in claim 1 including in addition a plurality of pseudo-random electrical conductors coupled to the plurality of pseudo-randomly positioned, non-linear nano-diodes to form non-linear mixer elements positioned to pseudo-randomly couple one of the plurality of address ports and the data output structure to a high dimensional plurality of the plurality of nano-memory elements.

11. A quantum random address memory as claimed in claim 10 wherein the plurality of pseudo-randomly positioned, non-linear nano-diodes includes a plurality of semiconductor columns each connected to the one of the plurality of address ports and the data output structure by a Schottky junction.

12. A quantum random address memory as claimed in claim 1 including in addition a plurality of semiconductor columns each having one of the plurality of nano-memory elements and one of the plurality of pseudo-randomly positioned, nonlinear nano-diodes formed therein.

13. A quantum random address memory as claimed in claim 12 wherein the plurality of semiconductor columns extend from the plurality of address ports to the data output structure.

14. A quantum random address memory with nano-diode mixer comprising:

a plurality of address ports providing a low dimensional plurality of addresses;

a plurality of nano-memory elements pseudo-randomly placed on a support structure;

pseudo-randomly positioned, non-linear nano-diodes coupling the address ports to a high dimensional plurality of the plurality of nano-memory elements;

similarity or comparison structure coupled to the plurality of nano-memory elements for detecting a read-out pattern of the plurality of nano-memory elements for each address applied to the plurality of address ports; and data output ports coupled to the similarity or comparison structure for providing an output signal for each address applied to the plurality of address ports, wherein the high dimensional plurality of nano-memory elements is greater than the low dimensional plurality of addresses by a number resulting in substantially error free memory recalls.

15. A quantum random address memory as claimed in claim 14 including in addition a plurality of pseudo-random electrical conductors coupled to the plurality of pseudo-randomly positioned, non-linear nano-diodes to form non-linear mixer elements positioned to pseudo-randomly couple one of the plurality of address ports and the data output structure to a high dimensional plurality of the plurality of nano-memory elements.

16. A quantum random address memory as claimed in claim 15 wherein the plurality of pseudo-randomly positioned, non-linear nano-diodes includes a plurality of semiconductor columns each connected to the one of the plurality of address ports and the data output structure by a Schottky junction.

17. A quantum random address memory as claimed in claim 14 including in addition a plurality of semiconductor columns each having one of the plurality of nano-memory elements and one of the plurality of pseudo-randomly positioned, non-linear nano-diodes formed therein.

18. A quantum random address memory as claimed in claim 17 wherein the plurality of semiconductor columns extend from the plurality of address ports to the data output structure.

* * * * *